United States Patent [19]

Kusumi

[11] Patent Number: 5,541,451
[45] Date of Patent: Jul. 30, 1996

[54] PACKAGED SEMICONDUCTOR DEVICE WITH EXTERNAL LEADS HAVING ANCHOR HOLES PROVIDED AT POLYAMIDE/GLASS SEALED REGIONS

[75] Inventor: Megumi Kusumi, Kawasaki, Japan

[73] Assignee: Kabushiki Kaisha Toshiba, Kawasaki, Japan

[21] Appl. No.: 554,105

[22] Filed: Nov. 6, 1995

Related U.S. Application Data

[63] Continuation of Ser. No. 327,641, Oct. 24, 1994, abandoned.

[51] Int. Cl.⁶ .................................................. H01L 23/12
[52] U.S. Cl. ........................ 257/704; 257/669; 257/690; 257/710; 257/794
[58] Field of Search .................................. 257/669, 773, 257/792, 794, 690, 704, 787, 710

[56] References Cited

U.S. PATENT DOCUMENTS 4,607,276   8/1986   Butt ........................................ 257/773
4,725,692   2/1988   Ishii et al. ............................... 174/52

FOREIGN PATENT DOCUMENTS 61-147555   7/1986   Japan.
3296253    12/1991   Japan.

Primary Examiner—Jerome Jackson
Assistant Examiner—Nathan K. Kelley
Attorney, Agent, or Firm—Finnegan, Henderson, Farabow, Garrett & Dunner, L.L.P.

[57] ABSTRACT

A semiconductor device has a semiconductor chip and a ceramic envelope consisting of a base portion and a sealing portion sealing the chip, and has good high-speed operability, radiation properties and electric characteristics. Leads made of Cu and electrically connected to the semiconductor chip are held between the base portion and the sealing portion, and have anchor holes formed in the portions thereof held therebetween. A glass-based adhesive is coated in the anchor holes, between the held portions of the leads and the base portion, and between the held portions and the sealing portion.

9 Claims, 4 Drawing Sheets

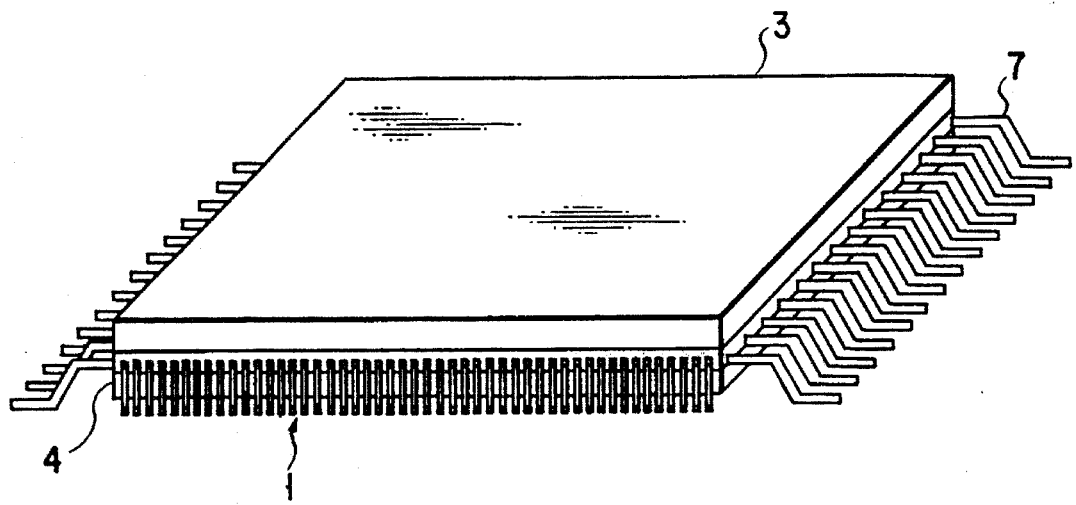
F I G. 1
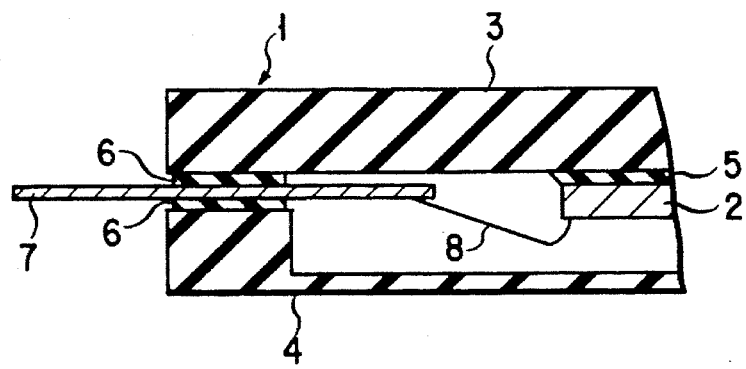
F I G. 2
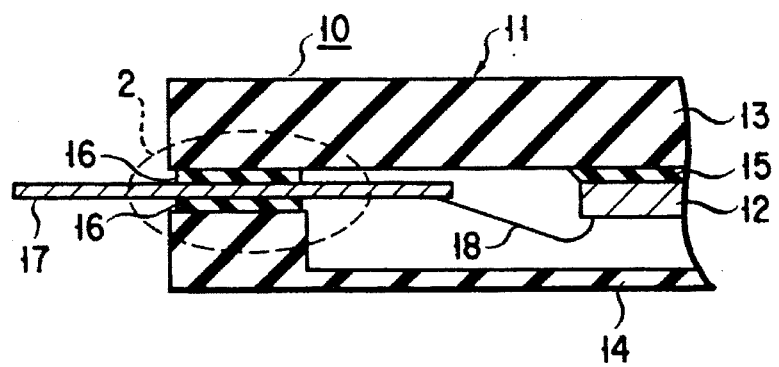
F I G. 3

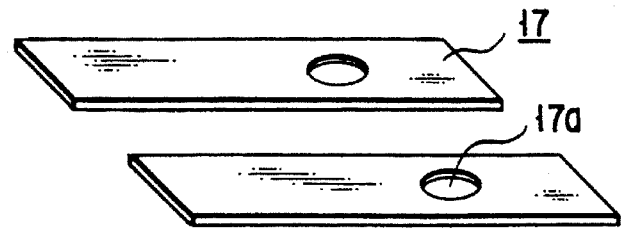
F I G. 4
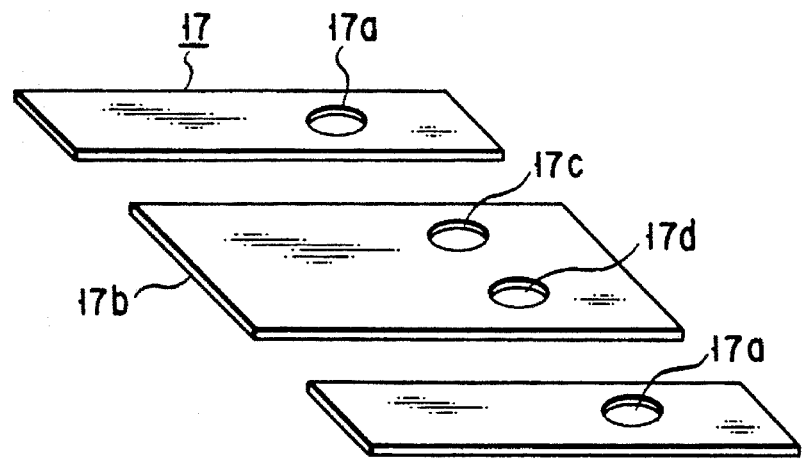
F I G. 5
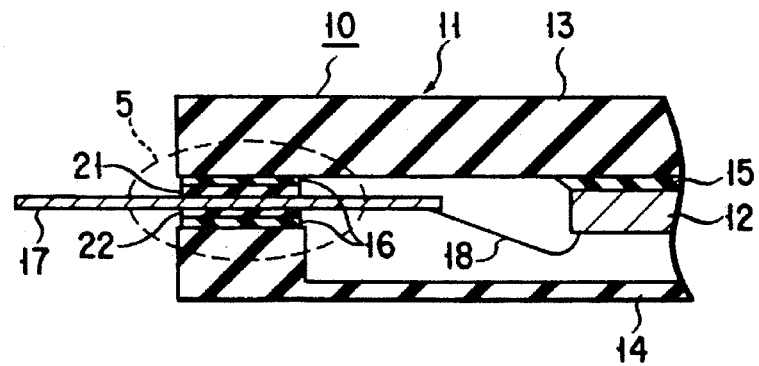
F I G. 6

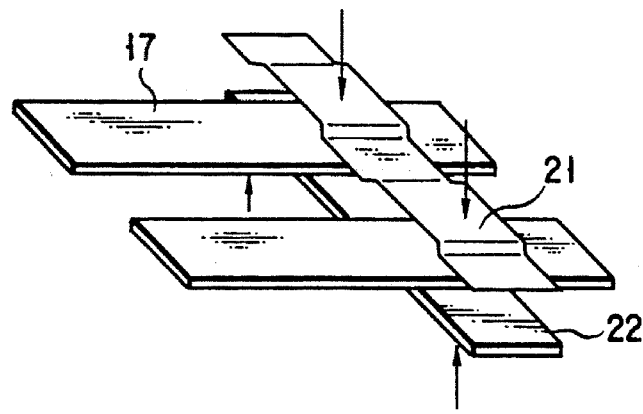
F I G. 7
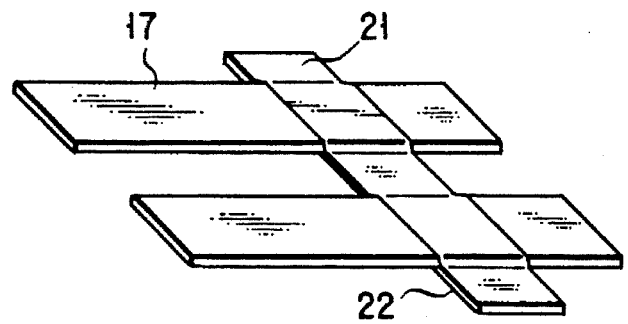
F I G. 8
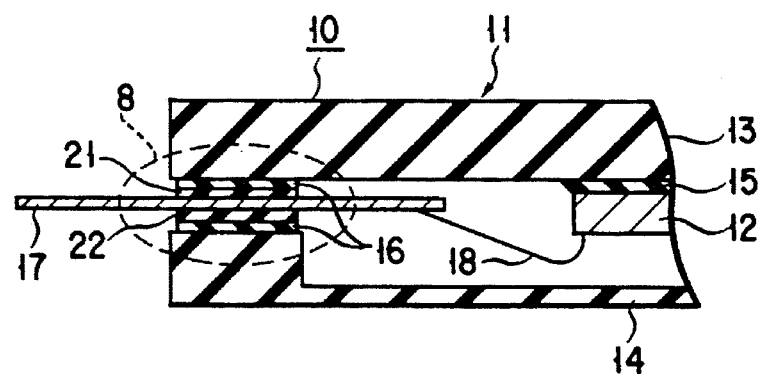
F I G. 9

5,541,451

PACKAGED SEMICONDUCTOR DEVICE WITH EXTERNAL LEADS HAVING ANCHOR HOLES PROVIDED AT POLYAMIDE/GLASS SEALED REGIONS

This application is a continuation of application Ser. No. 08/327,641 filed Oct. 24, 1994, now abandoned.

BACKGROUND OF THE INVENTION

1. Field of the Invention

This invention relates to a semiconductor device which is operable at a high speed of several hundreds MHz or more.

2. Description of the Related Art

FIG. 1 is a perspective view, showing a conventional semiconductor device, and FIG. 2 is a sectional view, showing an essential part of the semiconductor device of FIG. 1. As is shown in FIGS. 1 and 2, a semiconductor device 1 comprises a semiconductor chip 2, a base portion 3 and a sealing portion 4 which seal the chip 2 therebetween. The base portion 3 and the sealing portion 4 are formed of ceramic which has superior high-speed operability, radiation properties and electric characteristics.

Specifically, the semiconductor chip 2 is bonded to a center portion of the lower surface of the base portion 3, with a paste 5 interposed therebetween. An iron-based lead frame 7 is bonded to a peripheral portion of the lower surface of the base portion 3 with the use of a glass-based adhesive 6 (42 alloy). An end of the lead frame 7 is electrically connected to the semiconductor chip 2 by means for a bonding wire 8. A peripheral portion of the sealing portion 4 is attached to the lower surface of the lead frame 7 by means of the adhesive 6. The sealing portion 4 seals the semiconductor chip 2, the bonding wire 8 and part of the lead frame 7.

"42 alloy", which is the material of the lead frame 7, has an expansion coefficient substantially the same as the glass-based adhesive 6. However, this alloy has inferior electric characteristics, and hence cannot be used in a semiconductor device which is to be operated at high speed. Specifically, "42 alloy" has high resistance and magnetism, and therefore its inductance changes depending upon frequency. As a result, in a higher frequency band, the output waveform is distorted as compared with the input waveform. This being so, a 42-alloy lead frame cannot be used in a semiconductor device which must be operated at a high speed.

The above problem can be solved by using, as the material of the lead frame, Cu having superior electric characteristics. In this case, however, cracks may occur in the glass-based adhesive 6 due to a difference between the expansion coefficients of the adhesive 6 and Cu, degrading the reliability of the semiconductor device.

SUMMARY OF THE INVENTION

It is the object of the invention to provide a semiconductor device employing a Cu lead frame which is operable at a high speed of several hundreds MHz or more and in a reliable manner.

According to a first aspect of the invention, there is provided a semiconductor device comprising:

an envelope including a base portion and a sealing portion;

a semiconductor chip provided in the envelope;

a plurality of leads made of Cu and electrically connected to the semiconductor chip, each of the leads being held between the base portion and the sealing portion;

anchor holes formed in those portions of the leads which are located between the base portion and the sealing portion; and a glass-based adhesive coated in each of the anchor holes, between the leads and the base portion, and between the leads and the sealing portion.

According to a second aspect of the invention, there is provided a semiconductor device comprising:

an envelope including a base portion and a sealing portion;

a semiconductor chip provided in the envelope;

a plurality of leads made of Cu and electrically connected to the semiconductor chip, each of the leads being held between the base portion and the sealing portion;

polyimide coated on that portion of each lead which is held between the base portion and the sealing portion; and a glass-based adhesive provided between the polyimide and the base portion and between the polyimide and the sealing portion.

In this invention, polyimide is coated between the Cu leads and the base portion and between the Cu leads and the sealing portion, with the use of a glass-based adhesive. This structure enhances the adhesion between the leads and polyimide and between polyimide and the glass-based adhesive, thereby enhancing the adhesion between the leads and the glass-based adhesive. Therefore, even when leads made of Cu, which enables high-speed operation of several hundreds MHz or more, are used, occurrence of cracks can be prevented.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a perspective view, showing a conventional semiconductor device;

FIG. 2 is a cross sectional view, showing an essential part of the semiconductor device of FIG. 1;

FIG. 3 is a cross sectional view, showing an essential part of a semiconductor device according to a first embodiment of the invention;

FIG. 4 is a perspective view, showing an essential part of a lead frame incorporated in the semiconductor device of FIG. 3;

FIG. 5 is a perspective view, showing an essential part of a lead frame incorporated in a semiconductor device according to a second embodiment of the invention;

FIG. 6 is a cross sectional view, showing part of a semiconductor device according to a third embodiment;

FIG. 7 is a perspective view, showing an essential part of a lead frame incorporated in the semiconductor device of FIG. 6;

FIG. 8 is a perspective view, showing an essential part of a lead frame incorporated in the semiconductor device of FIG. 6;

FIG. 9 is a cross sectional view, showing an essential part of a lead frame incorporated in a semiconductor device according to a fourth embodiment of the invention;

DETAILED DESCRIPTION OF THE PREFERRED EMBODIMENTS

Figure 10:
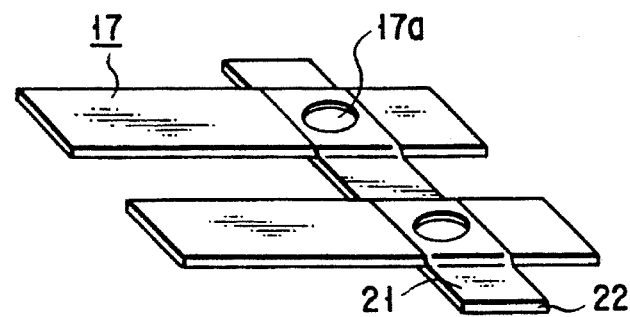
FIG. 10 is a perspective view, showing an essential part of a lead frame incorporated in the semiconductor device of FIG. 9.

The embodiments of the invention will be explained with reference to the accompanying drawings.

FIG. 3 is a cross sectional view, showing an essential part of a lead frame incorporated in a semiconductor device according to a first embodiment of the invention. FIG. 4 is a perspective view, showing an essential part 2 of the semiconductor device of FIG. 3. A semiconductor device 11 has a base portion 13 and a sealing portion 14 which serve as an envelope 10, and a semiconductor chip 12 sealed by them. The base portion 13 and the sealing portion 14 are formed of ceramic which has superior high-speed operability, radiation properties and electric characteristics.

As is shown in FIG. 3, the semiconductor chip 12 is adhered to a center portion of the lower surface of the base portion 13 by means of a paste 15. A lead 17 formed of Cu is adhered to a peripheral portion of the lower surface of the base portion 13 by means of a glass-based adhesive 16. The lead 17 has an end electrically connected to the semiconductor chip 12 by means of a bonding wire 18. A peripheral portion of the sealing portion 14 is attached to the lower surface of the lead 17 by means of the adhesive 16. In other words, the lead 17 is held between the base portion 13 and the sealing portion 14. As shown in FIG. 4, an anchor hole 17a is formed in the held portion of the lead 17. The adhesive 16 coat in each of the anchor hole 17a, between the lead 17 and the base portion 13, and between the lead 17 and the sealing portion 14. The anchor hole 17a is filled with the adhesive 16. The base portion 13 and the sealing portion 14 seal the chip 12, the bonding wire 18 and part of the lead 17.

As described above, in the first embodiment, the Cu anchor hole 17a is formed in the lead 17, and the lead 17 is adhered to the base portion 13 and the sealing portion 14 by the glass-based adhesive 16, with the anchor hole 17a filled with the adhesive 16. Therefore, the adhesion between the lead 17 and the adhesive 16 is high. This can prevent occurrence of cracks in the glass-based adhesive 16 even where a Cu lead having superior electric characteristics is employed. Thus, the semiconductor device 11 incorporating the Cu lead 17 can operate with high reliability at a high speed of several hundreds MHz or more, without degrading radiation properties.

Further, the Cu lead 17 can reduce the manufacturing cost of the overall semiconductor device 11 as compared with the conventional device, since Cu is cheaper than 42 alloy which is used as the material of a lead employed in the conventional device.

Although in the first embodiment, each lead 17 of the lead frame has a single anchor hole, a plurality of anchor holes may be formed in each lead.

FIG. 5 is a perspective view, showing an essential part of a lead frame employed in a semiconductor device according to a second embodiment. In FIG. 5, elements similar to those shown in FIG. 4 are denoted by corresponding reference numerals, and only elements which differ from those in the first embodiment will be explained.

In a lead portion 17, a lead 17b is formed as a GND line, and has a great width in consideration of the density of current flowing therethrough. Only the lead 17b has first and second anchor holes 17c and 17d formed in a portion thereof to which an adhesive 16 is attached, while each of the other leads 17 has a single anchor hole 17a.

The above-described second embodiment can provide the same advantage as the first embodiment.

FIG. 6 is a cross sectional view, showing part of a semiconductor device according to a third embodiment of the invention. In FIG. 6, elements similar to those shown in FIG. 3 are denoted by corresponding reference numerals, and only elements which differ from those in the first embodiment will be explained.

A glass-based adhesive 16 is adhered to a peripheral portion of the lower surface of the base portion 13. A polyimide film 21 is formed between the lead 17 and the adhesive 16 by photoetching. A polyimide tape 22 is provided between the lead 17 and the sealing portion 14, with the adhesive interposed therebetween.

FIGS. 7 and 8 are perspective views, illustrating the process of forming polyimide on the upper and lower surfaces of an essential part 5 of a lead frame employed in the semiconductor device of FIG. 6. Referring first to FIG. 7, the polyimide tape 22 is attached to the lower surface 1 of the lead 17. Then, the polyimide film 21 is coated on the upper surface of the lead 17, and etched by photoetching such that only the portion of the film 21 which is located on the polyimide tape 22 remains. By virtue of the photoetching, the polyimide film 21 is formed on the polyimide tape 22 and on those portions of the upper surface and the side surfaces of the lead 17, which are located at a peripheral portion of the lower surface of the base portion 13, with no space therebetween. Thus, those portions of the lead 17 which are located at a peripheral portion of the lower surface of the base portion 13 are coated with the polyimide film 21 having a predetermined thickness.

In the above-described third embodiment, the polyimide films 21 and 22 are formed on those portions of the Cu lead 17 which are located at a peripheral portion of the lower surface of the base portion 13, with no space therebetween, and the films 21 and 22 are adhered to the base portion 13 and the sealing portion 14 by means of the adhesive 16. As a result, high adhesion can be realized between the lead 17 and the polyimide films 21 and 22 and between the polyimide films 21 and 22 and the adhesive 16, thereby enhancing the adhesion between the lead 17 and the glass-based adhesive 16. This being so, even where the lead 17 is made of Cu having superior electric characteristics, occurrence of cracks in the glass-based adhesive 16 can be prevented. The semiconductor device of the invention which employs the Cu lead 17 can be operated in a reliable manner at a high speed of several hundreds MHz or more, without degrading the radiation properties.

Further, using the Cu lead 17 in the semiconductor device 11 can reduce the manufacturing cost of the overall semiconductor device 11 as compared with the conventional device.

FIG. 9 is a cross sectional view, showing an essential part of a semiconductor device according to a fourth embodiment of the invention. FIG. 10 is a perspective view, showing an essential part 8 of a lead frame employed in the semiconductor device of FIG. 9. In FIGS. 9 and 10, elements similar to those shown in FIGS. 6 and 7 are denoted by corresponding reference numerals, and only elements which differ from those in the third embodiment will be explained.

The lead 17 has an anchor hole 17a formed in the portion thereof corresponding to a peripheral portion of the lower surface of the base portion 13. The anchor hole 17a is filled with a polyimide film 21 by photoetching, with no space therein.

As is shown in FIG. 10, a polyimide tape 22 is attached on the portion of the lower surface of the lead 17 in which the anchor holes 17a is formed. The polyimide film 21 is coated on the upper surface and the side surfaces of the lead 17, on the periphery of the hole 17a and on the polyimide tape 22, with no space therein.

The above fourth embodiment has the same advantage as the third embodiment. Further, the anchor hole 17a formed in the lead 17 in the fourth embodiment enhances the adhesion between the lead 17 and the polyimide films 21 and 22 and between the polyimide films 21 and 22 and the glass-based adhesive 16.

Figure 11:
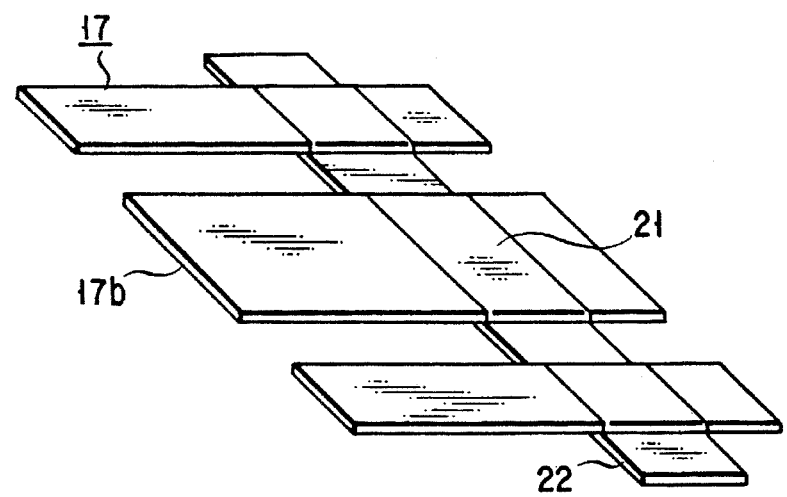
FIG. 11 is a cross sectional view, showing an essential part of a lead frame incorporated in a semiconductor device according to a fifth embodiment of the invention.

FIG. 11 is a perspective view, showing an essential part of a lead frame employed in a semiconductor device according to a fifth embodiment. In FIG. 11, elements similar to those shown in FIG. 8 are denoted by corresponding reference numerals, and only elements which differ from those in the third embodiment will be explained.

In a lead portion 17, a lead 17b is formed as a GND line, and has a great width in consideration of the density of current flowing therethrough.

The fifth embodiment also can provide the same advantage as the third embodiment.

Figure 12:
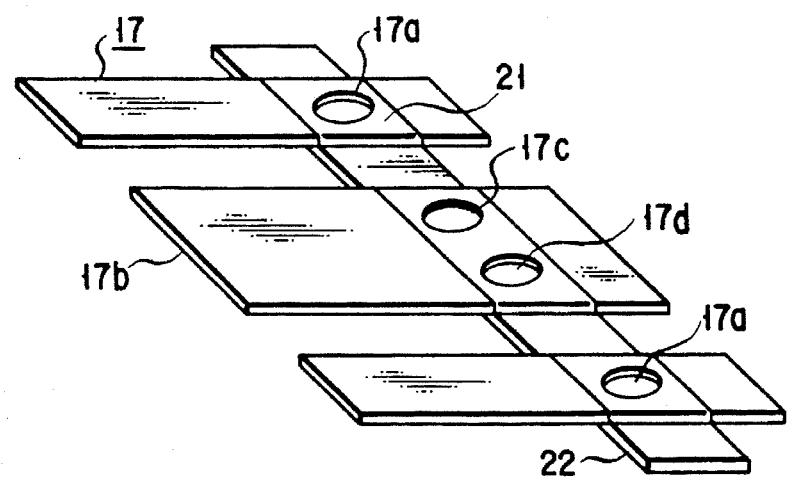
FIG. 12 is a cross sectional view, showing an essential part of a lead frame incorporated in a semiconductor device according to a sixth embodiment of the invention.

FIG. 12 is a perspective view, showing an essential part of a lead frame employed in a semiconductor device according to a sixth embodiment. In FIG. 12, elements similar to those shown in FIG. 10 are denoted by corresponding reference numerals, and only elements which differ from those in the fourth embodiment will be explained.

In a lead portion 17, a lead 17b is formed as a GND line, and has a great width in consideration of the density of current flowing therethrough. Only the lead 17b has first and second anchor holes 17c and 17d, while each of the other leads 17 has a single anchor hole 17a.

The sixth embodiment also can provide the same advantage as the fourth embodiment.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor device comprising:

an envelope including a base portion and a sealing portion;

a semiconductor chip provided in the envelope;

a plurality of leads made of Cu and electrically connected to the semiconductor chip, each of the leads having a portion held between the base portion and the sealing portion;

holes formed only in the portions of the leads located between the base portion and the sealing portion; and a glass-based adhesive coated in each of the holes, between the leads and the base portion, and between the leads and the sealing portion.

2. The semiconductor device according to claim 1, wherein one of the leads is formed as a power supply line, and has a width greater than the other leads.

3. The semiconductor device according to claim 2, wherein said one of the leads has a plurality of holes.

4. A semiconductor device comprising:

an envelope including a base portion and a sealing portion;

a semiconductor chip provided in the envelope;

a plurality of leads made of Cu and electrically connected to the semiconductor chip, each of the leads having a portion held between the base portion and the sealing portion;

polyamide provided between the base portion and an entire upper surface of said portion of each lead held between the base and sealing portions, and between the sealing portion and an entire lower surface of said portion of each lead held between the base and sealing portions; and a glass-based adhesive provided between the polyamide and the base portion and between the polyamide and the sealing portion, wherein the polyamide shields the entire portion of each lead located between the base portion and the sealing portion from the glass-based adhesive.

5. The semiconductor device according to claim 4, wherein one of the leads is formed as a power supply line, and has a width greater than the other leads.

6. A semiconductor device comprising:

an envelope including a base portion and a sealing portion;

a semiconductor chip provided in the envelope;

a plurality of leads made of Cu and electrically connected to the semiconductor chip, each of the leads having a portion held between the base portion and the sealing portion;

holes formed only in the portions of the leads located between the base portion and the sealing portion;

polyamide provided in the holes, between the base portion and an entire upper surface of said portion of each lead held between the base and sealing portions, and between the sealing portion and an entire lower surface of said portion of each lead held between the base and sealing portions; and a glass-based adhesive provided between the polyamide and the base portion and between the polyamide and the sealed portion.

7. The semiconductor device according to claim 6, wherein one of the leads is formed as a power supply line, and has a width greater than the other leads.

8. The semiconductor device according to claim 7, wherein said one of the leads has a plurality of holes.

9. A semiconductor device according to claim 4, wherein said polyamide is polyamide tape.

* * * * *

UNITED STATES PATENT AND TRADEMARK OFFICE
CERTIFICATE OF CORRECTION

PATENT NO. : 5,541,451
DATED : July 30, 1996
INVENTOR(S) : Megumi KUSUMI

It is certified that error appears in the above-indentified patent and that said Letters Patent is hereby corrected as shown below:

Title page, column 1, below "[63] Continuation of Ser. No. 327,641, Oct. 24, 1994, abandoned.", insert
--Foreign Application Priority Data
October 25, 1993  [JP]  Japan..............5-266337--.

Signed and Sealed this

Nineteenth Day of November, 1996

Attest:

BRUCE LEHMAN

Attesting Officer

Commissioner of Patents and Trademarks